(12) United States Patent
Wei et al.

(10) Patent No.: US 8,238,102 B2
(45) Date of Patent: Aug. 7, 2012

(54) HEAT DISSIPATION APPARATUS FOR ELECTRONIC DEVICE

(75) Inventors: Chao-Ke Wei, Taipei Hsien (TW); Wen-Chen Wang, Taipei Hsien (TW)

(73) Assignee: Hon Hai Precision Industry Co., Ltd., Tu-Cheng, New Taipei (TW)

( * ) Notice: Subject to any disclaimer, the term of this patent is extended or adjusted under 35 U.S.C. 154(b) by 243 days.

(21) Appl. No.: 12/713,196

(22) Filed: Feb. 26, 2010

(65) Prior Publication Data
US 2011/0110044 A1 May 12, 2011

(30) Foreign Application Priority Data
Nov. 12, 2009 (CN) .......................... 2009 1 0309646

(51) Int. Cl.
*H05K 7/20* (2006.01)
*H01L 23/34* (2006.01)
(52) U.S. Cl. ........ 361/704; 361/707; 361/714; 361/717; 361/679.54
(58) Field of Classification Search ............. 361/679.54, 361/704, 707, 714, 717
See application file for complete search history.

(56) References Cited

U.S. PATENT DOCUMENTS

| | | | | |
|---|---|---|---|---|
| 4,415,025 A * | 11/1983 | Horvath | ................. | 165/185 |
| 4,674,005 A * | 6/1987 | Lacz | ................. | 361/708 |
| 4,707,726 A * | 11/1987 | Tinder | ................. | 174/252 |
| 4,845,590 A * | 7/1989 | Mikolajczak | ................. | 361/720 |
| 4,891,735 A * | 1/1990 | Mikolajczak | ................. | 361/809 |
| 4,922,601 A * | 5/1990 | Mikolajczak | ................. | 29/450 |
| 5,065,279 A * | 11/1991 | Lazenby et al. | ................. | 361/720 |
| 5,089,936 A * | 2/1992 | Kojima et al. | ................. | 361/705 |
| 5,190,097 A * | 3/1993 | Selby et al. | ................. | 165/80.2 |
| 5,247,425 A * | 9/1993 | Takahasi | ................. | 361/717 |
| 5,274,193 A * | 12/1993 | Bailey et al. | ................. | 174/16.3 |
| 5,402,313 A * | 3/1995 | Casperson et al. | ................. | 361/710 |
| 5,812,375 A * | 9/1998 | Casperson | ................. | 361/707 |
| 5,933,325 A * | 8/1999 | Hou | ................. | 361/704 |
| 6,043,981 A * | 3/2000 | Markow et al. | ................. | 361/704 |
| 6,065,530 A * | 5/2000 | Austin et al. | ................. | 165/80.3 |
| 6,870,738 B2 * | 3/2005 | Goebl | ................. | 361/719 |
| 6,986,679 B1 * | 1/2006 | Aronson et al. | ................. | 439/374 |
| 7,164,586 B2 * | 1/2007 | Lin | ................. | 361/714 |
| 7,715,196 B2 * | 5/2010 | Chen et al. | ................. | 361/719 |
| 7,898,808 B2 * | 3/2011 | Joiner et al. | ................. | 361/707 |
| 7,916,491 B2 * | 3/2011 | Fino et al. | ................. | 361/752 |
| 7,974,098 B2 * | 7/2011 | Oki et al. | ................. | 361/715 |
| 8,014,152 B2 * | 9/2011 | Nishiuma et al. | ................. | 361/719 |
| 2003/0169983 A1 * | 9/2003 | Branch et al. | ................. | 385/92 |
| 2004/0027816 A1 * | 2/2004 | Ice | ................. | 361/797 |
| 2004/0136162 A1 * | 7/2004 | Asai et al. | ................. | 361/715 |
| 2004/0156173 A1 * | 8/2004 | Jeong | ................. | 361/704 |
| 2008/0232067 A1 * | 9/2008 | Joiner et al. | ................. | 361/707 |
| 2009/0002949 A1 * | 1/2009 | Pawlenko et al. | ................. | 361/707 |
| 2009/0067131 A1 * | 3/2009 | Yasuda et al. | ................. | 361/707 |
| 2010/0053897 A1 * | 3/2010 | Kusaka et al. | ................. | 361/697 |

FOREIGN PATENT DOCUMENTS
JP 04048797 A * 2/1992
* cited by examiner

*Primary Examiner* — Anatoly Vortman
(74) *Attorney, Agent, or Firm* — Altis Law Group, Inc.

(57) ABSTRACT

A heat dissipation apparatus adapted for cooling an electronic component received in a metal housing includes a heat sink thermally attached to the electronic component and a plurality of resilient tabs arranged between the heat sink and the metal housing. The resilient tabs are elastically deformed by the metal housing and thermally contact an inner face of the metal housing.

14 Claims, 4 Drawing Sheets

//HEAT DISSIPATION APPARATUS FOR ELECTRONIC DEVICE

BACKGROUND

1. Technical Field

The disclosure relates to heat dissipation apparatuses, and particularly to a heat dissipation apparatus for use in an electronic device.

2. Description of Related Art

Nowadays, with the development of electronic technology, an electronic device such as a computer or a server is devised to be much thinner and smaller than before, yet hold many more electronic modules. However, the electronic modules generate a large amount of heat during operation. The interior space of the electronic device is very limited, and the electronic modules occupy much of that space, which results in heat generated by the electronic modules accumulating rather than being dissipated in timely manner.

What is needed, therefore, is a heat dissipation apparatus for an electronic device which can overcome the limitation described.

BRIEF DESCRIPTION OF THE DRAWINGS

Many aspects of the present embodiments can be better understood with reference to the following drawings. The components in the drawings are not necessarily drawn to scale, the emphasis instead being placed upon clearly illustrating the principles of the present embodiments. Moreover, in the drawings, like reference numerals designate corresponding parts throughout the several views.

DETAILED DESCRIPTION

Figure 1:
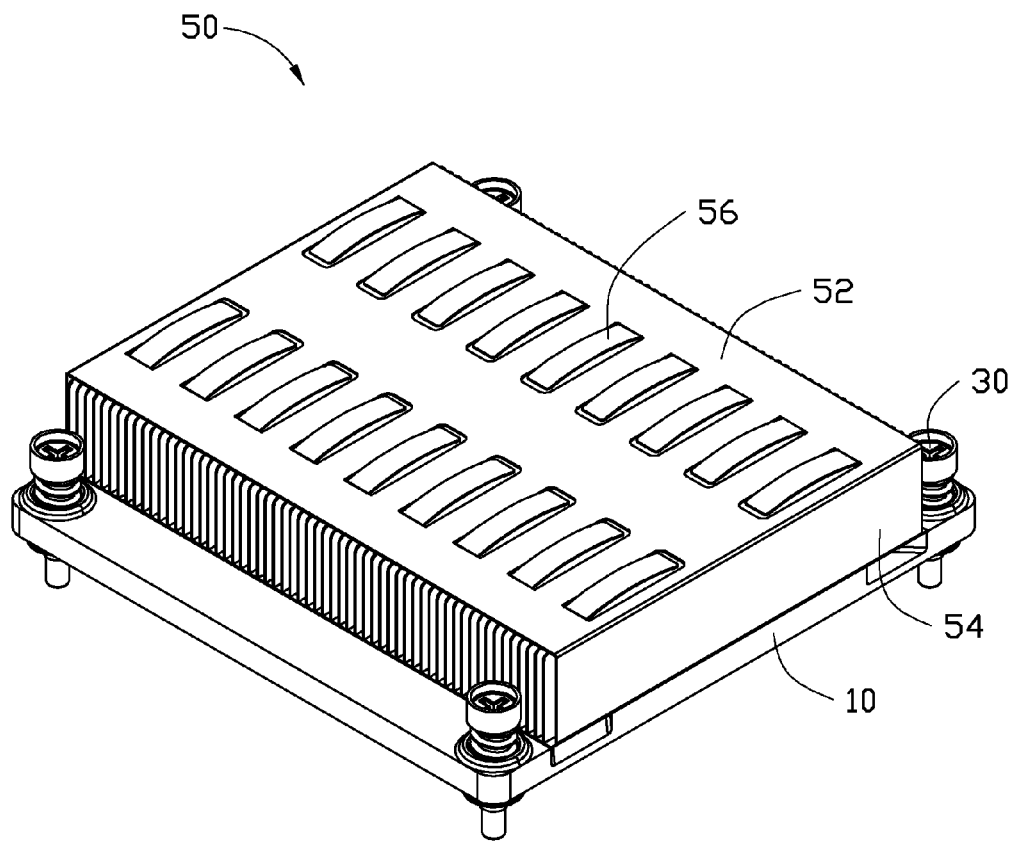
FIG. 1 is an isometric, assembled view of a heat dissipation apparatus in accordance with one embodiment of the disclosure.
Figure 4:
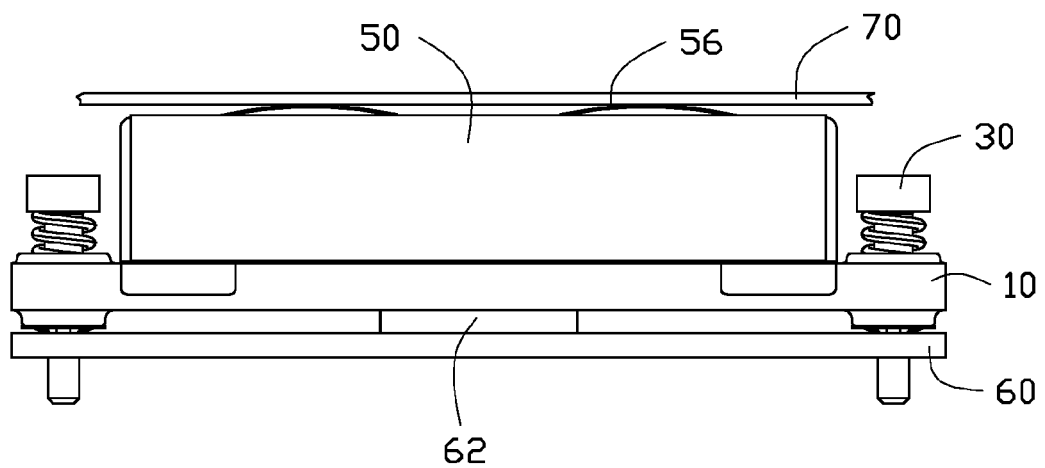
FIG. 4 is a cross-sectional view of an electronic device incorporated with the heat dissipation apparatus of FIG. 1.

Referring to FIGS. 1 and 4, an electronic device in accordance with an embodiment of the disclosure includes a metal housing 70, a heat dissipation apparatus received in the metal housing 70, and a printed circuit board 60. The heat dissipation apparatus is used for dissipating heat from an electronic component 62 on the printed circuit board 60 and includes a heat sink and a cover 50 covering the heat sink.

Figure 2:
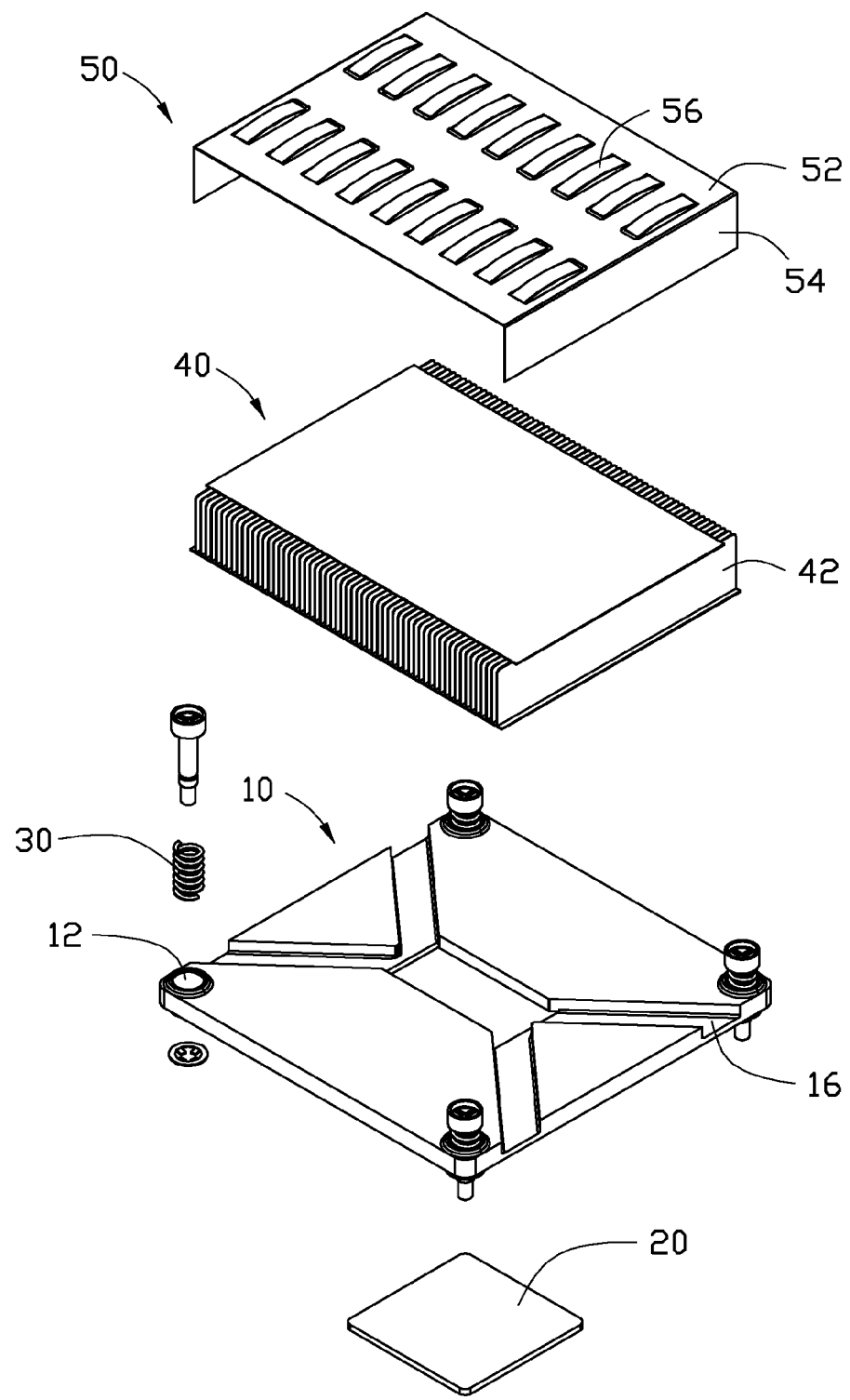
FIG. 2 is an isometric, exploded view of the heat dissipation apparatus of FIG. 1.
Figure 3:
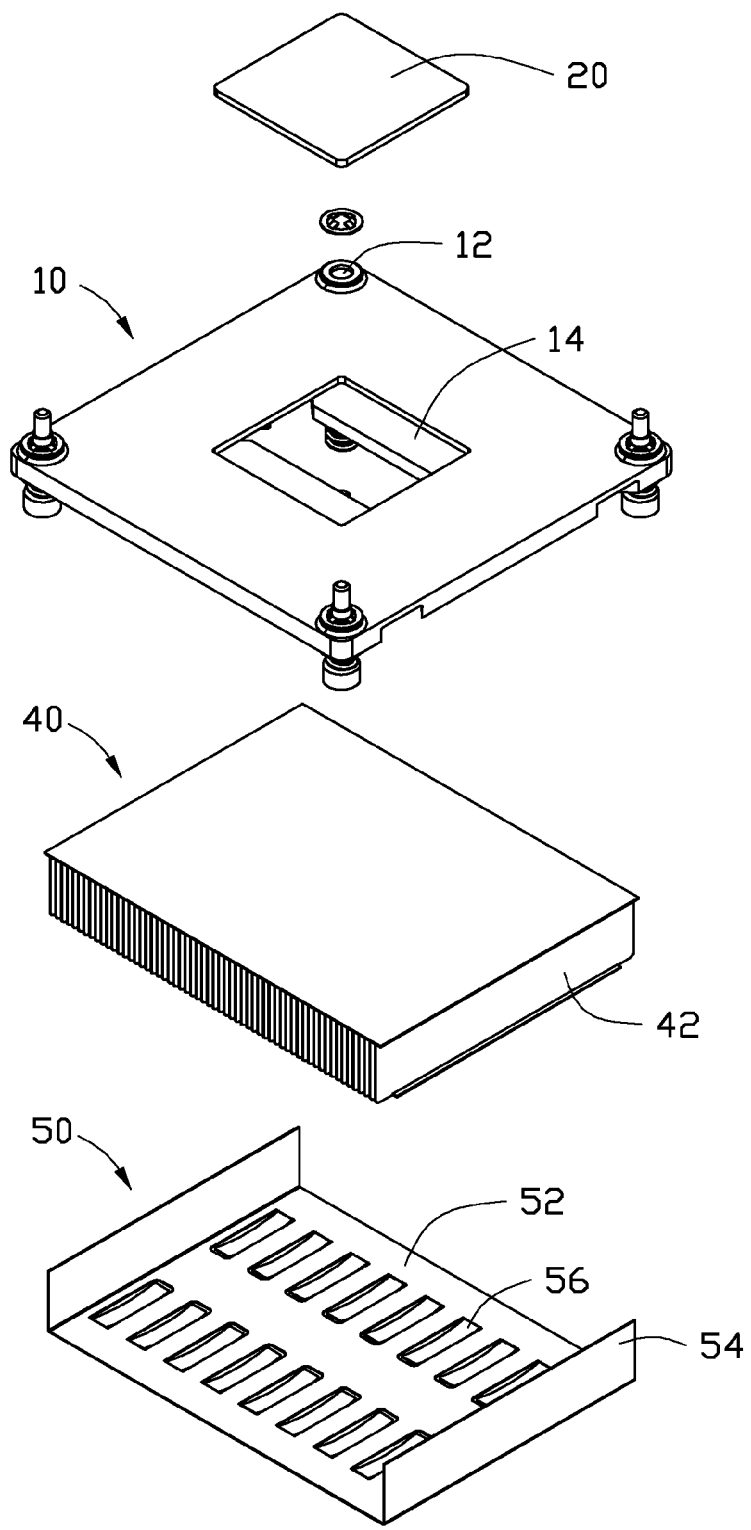
FIG. 3 is an inverted view of the heat dissipation apparatus of FIG. 2.

Also referring to FIGS. 2 and 3, the heat sink includes a heat conducting plate 10, a heat spreader 20 mounted at a bottom of the heat conducting plate 10, four fasteners 30 attached respectively to four corners of the heat conducting plate 10, and a fin assembly 40 mounted at a top of the heat conducting plate 10.

The heat conducting plate 10 is made of metal such as aluminum, copper or an alloy thereof and defines a rectangular groove 14 in a center of the bottom thereof. The heat spreader 20 is received in the groove 14. Four through holes 12 are defined in the four corners of the heat conducting plate 10. The fasteners 30 extend through the through holes 12 of the heat conducting plate 10 and the printed circuit board 60 to mount the heat dissipation apparatus on the printed circuit board 60, and the heat spreader 20 is brought into intimate contact with the electronic component 62. An X-shaped receiving slot 16 adapted for receiving heat pipes (not shown) is defined in a center of the top of the heat conducting plate 10. A center of the receiving slot 16 communicates with the groove 14 so that a top face of the heat spreader 20 can thermally contact bottom faces of the heat pipes.

The fin assembly 40 includes a plurality of fins 42 stacked together. The fins 42 each are made of metal such as aluminum, copper or an alloy thereof and are spaced from each other.

The cover 50 is integrally made of a metal sheet and includes a rectangular body 52 and two side walls 54 vertically and downwardly extending from edges of two opposite sides of the body 52. The two side walls 54 are respectively adhered to two outmost fins 42 of the fin assembly 40 to fasten the cover 50 on the fin assembly 40, whereby a bottom face of the body 52 of the cover 50 thermally contacts top ends of the fins 42 of the fin assembly 40. A plurality of strip-shaped resilient tabs 56 is integrally formed by upwardly punching the body 52. Each resilient tab 56 protrudes upwardly relative to a top face of the body 52 and towards the metal housing 70, and has an arc-shaped profile, so that the metal housing 70 can not be scraped by the resilient tabs 56 when the heat dissipation apparatus is assembled in the metal housing 70. Each resilient tab 56 is elastically and slightly deformed by the metal housing 70 and a top of each resilient tab 56 contacts an inner face of the metal housing 70, so that heat from the electronic component 62 can be transmitted to the heat spreader 20, fin assembly 40, resilient tabs 56 and the metal housing 70 in sequence, and be removed efficiently and timely via the relatively larger surface area of the metal housing 70. Furthermore, since the metal housing 70 thermally contacts the heat sink via the resilient tabs 56 of the cover 50, so that another plate-shaped heat conducting medium thermally interconnecting the metal housing 70 and the heat sink is not needed.

It is believed that the disclosure and its advantages will be understood from the foregoing description, and it will be apparent that various changes may be made thereto without departing from the spirit and scope of the disclosure or sacrificing all of its material advantages, the examples hereinbefore described merely being preferred or exemplary embodiments of the disclosure.

What is claimed is:

1. A heat dissipation apparatus for cooling an electronic component received in a metal housing, comprising:
   a heat sink thermally attached to the electronic component; and
   a plurality of resilient tabs arranged between the heat sink and the metal housing, the resilient tabs being elastically deformed by the metal housing and thermally contacting an inner face of the metal housing;
   wherein the heat sink comprises a heat conducting plate and a rectangular heat spreader, the heat conducting plate defining a rectangular groove in a center of a bottom thereof, an X-shaped receiving slot adapted for receiving heat pipes being defined in a center of a top of the heat conducting plate, a center of the receiving slot communicating with the groove, the heat spreader being received in the groove and thermally contacting the electronic component.

2. The heat dissipation apparatus as claimed in claim 1, wherein a cover is attached on the heat sink, and the resilient tabs are formed on the cover.

3. The heat dissipation apparatus as claimed in claim 2, wherein the cover comprises a body and two side walls downwardly extending from two opposite sides of the body, and the two side walls are adhered to two opposite sides of the heat sink to fasten the cover on the heat sink, and the resilient tabs are formed on the body of the cover.

4. The heat dissipation apparatus as claimed in claim 3, wherein the resilient tabs are integrally formed by punching the body.

5. The heat dissipation apparatus as claimed in claim 3, wherein the heat sink further comprises a plurality of fins stacked together, and a bottom face of the body of the cover thermally contacts top ends of the fins.

6. The heat dissipation apparatus as claimed in claim 3, wherein each of the resilient tabs protrudes upwardly relative to a top face of the body and towards the metal housing, and has an arc-shaped profile.

7. The heat dissipation apparatus as claimed in claim 3, wherein each of the resilient tabs has an arc-shaped profile.

8. An electronic device, comprising:
a metal housing;
an electronic component received in the metal housing;
a heat sink thermally attached to the electronic component for removing heat of the electronic component; and
a plurality of resilient tabs arranged between the heat sink and the metal housing, the resilient tabs being elastically deformed by the metal housing and thermally contacting an inner face of the metal housing;
wherein the heat sink comprises a heat conducting plate and a rectangular heat spreader, the heat conducting plate defining a rectangular groove in a center of a bottom thereof, an X-shaped receiving slot adapted for receiving heat pipes being defined in a center of a top of the heat conducting plate, a center of the receiving slot communicating with the groove, the heat spreader being received in the groove and thermally contacting the electronic component.

9. The electronic device as claimed in claim 8, wherein a cover is attached on the heat sink, and the resilient tabs are formed on the cover.

10. The electronic device as claimed in claim 8, wherein the heat sink further comprises a plurality of fins, and the cover is attached on the fins of the heat sink and thermally contacts top ends of the fins.

11. The electronic device as claimed in claim 9, wherein the cover comprises a body and two side walls downwardly extending from two opposite sides of the body, and the two side walls are adhered to two opposite sides of the heat sink to fasten the cover on the heat sink, and the resilient tabs are formed on the body of the cover.

12. The electronic device as claimed in claim 11, wherein the resilient tabs are integrally formed by punching the body.

13. The electronic device as claimed in claim 11, wherein each of the resilient tabs protrudes upwardly relative to a top face of the body and towards the metal housing, and has an arc-shaped profile.

14. The electronic device as claimed in claim 8, wherein each of the resilient tabs has an arc-shaped profile.

* * * * *